United States Patent [19]

Fogelstrom

[11] 4,197,506

[45] Apr. 8, 1980

[54] PROGRAMMABLE DELAY LINE OSCILLATOR

[75] Inventor: Merle J. Fogelstrom, Los Angeles, Calif.

[73] Assignee: Electronic Memories & Magnetics Corporation, Los Angeles, Calif.

[21] Appl. No.: 919,158

[22] Filed: Jun. 26, 1978

[51] Int. Cl.² ............... H03K 1/16; H03K 1/18; H03K 3/86
[52] U.S. Cl. .................................. 328/66; 328/55; 331/179
[58] Field of Search ............... 328/66, 59, 55, 56; 331/179

[56] References Cited

U.S. PATENT DOCUMENTS

| | | | |
|---|---|---|---|
| 3,089,090 | 5/1963 | Price | 328/55 |
| 3,251,005 | 5/1966 | Taylor et al. | 331/179 |
| 3,588,707 | 6/1971 | Manship | 328/55 |
| 4,124,820 | 11/1978 | Arnstein | 328/66 |

*Primary Examiner*—John S. Heyman
*Attorney, Agent, or Firm*—Seymour A. Scholnick; Thomas A. Turner, Jr.

[57] ABSTRACT

An electronically programmable oscillator has a plurality of digitally incremented selectable frequency signal outputs, providing a wide range of incrementally distinguishable, selectable frequencies having defined pulse widths. Incremental frequency selection is made through delay lines and bypassable interpolating delay lines connected in series. Selectable bypassable delay loops can be inserted into the oscillator signal path by manually controlled electronic, programmable selections. The width and shape of the pulse is regulated at several stages of the circuit, using solid state electronic components.

18 Claims, 6 Drawing Figures

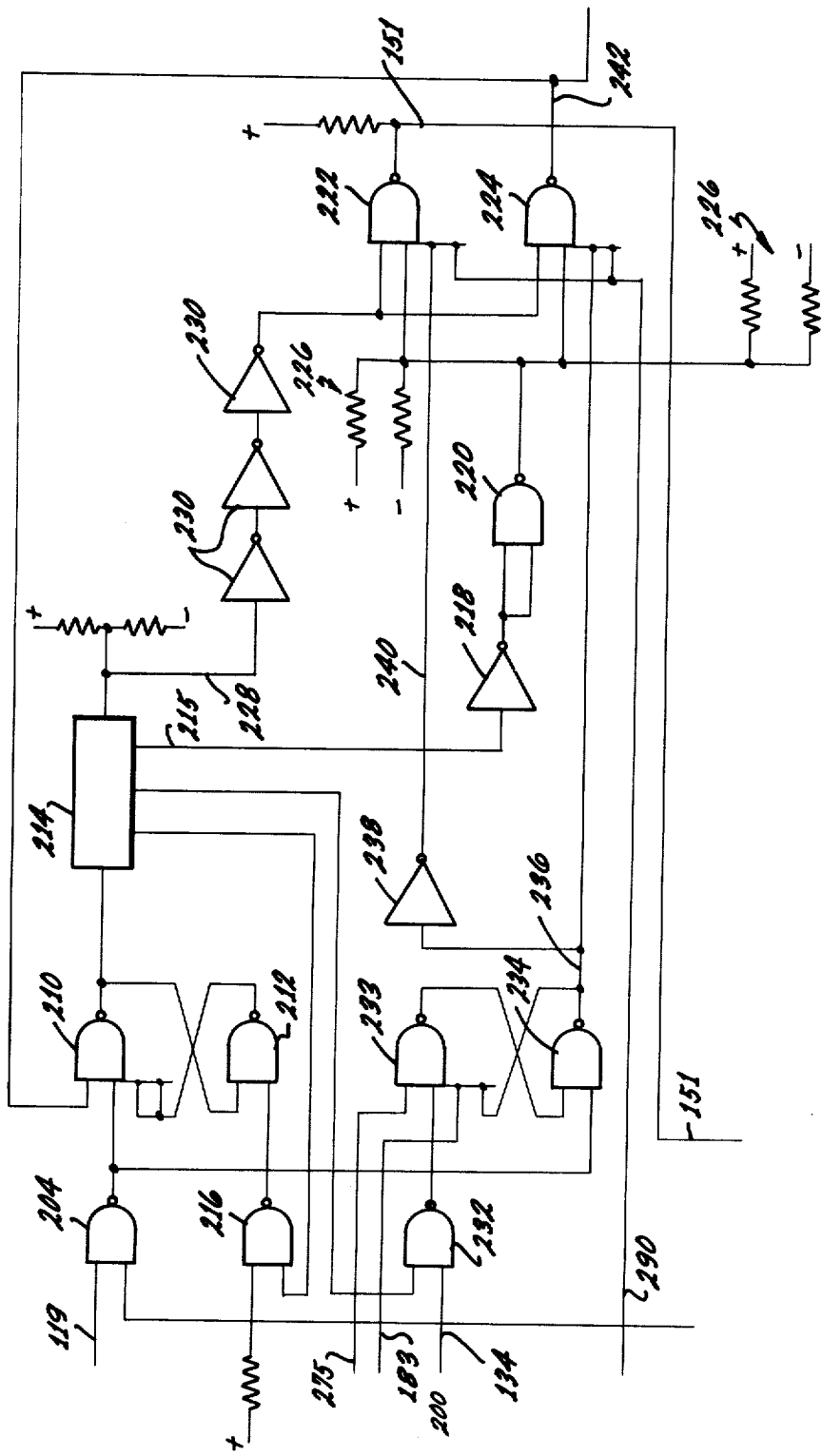

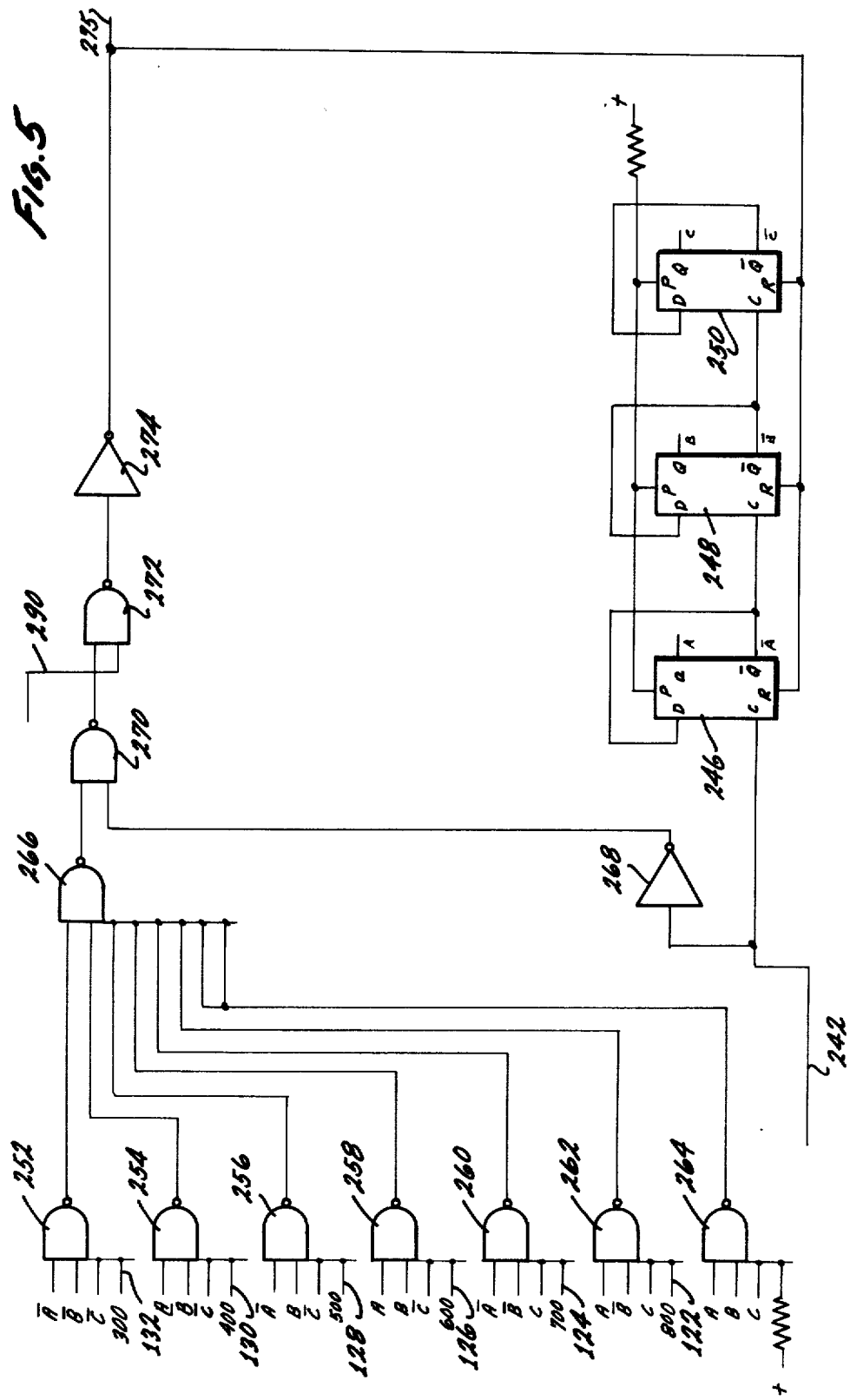

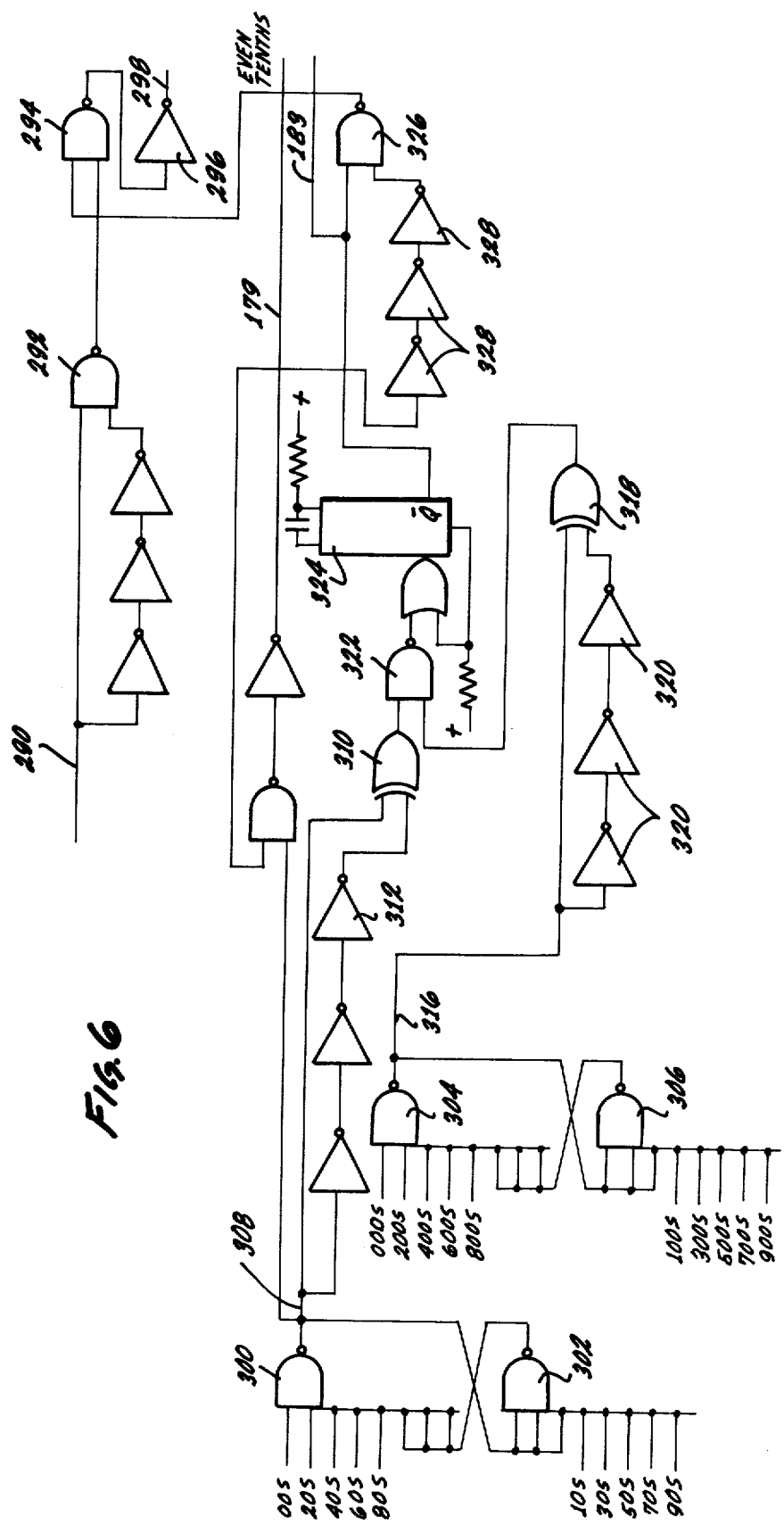

PROGRAMMABLE DELAY LINE OSCILLATOR

BACKGROUND OF THE INVENTION

1. Field of the Invention

The present invention relates to the repetitive generation of electronic signals, and more particularly to electronic signal oscillators having close tolerance, and highly precise signals in the very high frequency range measured in megacycles.

2. Description of the Prior Art

Frequency signal oscillators that generate electronic signals repetitively at consistent speeds or frequencies have a wide range of uses in electronic and electrical equipment. Testing equipment especially used for testing the responses of circuits in electronic and electrical equipment often require a frequency generator or oscillator. Preferably, the oscillator should cover a wide range of frequencies to test the electronic circuit equipment thoroughly.

In the past, such oscillators have been provided by multivibrators. Calibration of the frequency to be used in a test was accomplished by varying resistors or capacitors in the multivibrator oscillator. However testing of some of the very high speed electronic equipment presently available requires precise, stable readily controllable oscillator frequencies in the range of 10 to 1 megahertz (MHz) (i.e. cycle periods on the order of 100 to 1000 nanoseconds (ns)).

Conventional multivibrator oscillators, however, when tuned to a particular frequency, must be re-tuned or recalibrated for generation of signals at different frequencies.

Moreover the electrical tuning controls for such conventional oscillators have to be positioned at or very near the oscillators to minimize sensitive long leads which would otherwise pick up and convey excessive noise to the circuit, resulting in an unstable condition in the oscillator. In addition, multivibrator jitter on the order of nanoseconds between pulses, while acceptable in oscillators in the millisecond frequency range, made use of such multivibrator oscillators unreliable in the nanosecond range of frequencies.

It has been sought for some time to have and to use a very high speed frequency generator or signal oscillator capable of providing signals in the 100 to 1,000 nanosecond range having a stability of ±2 nanoseconds or better. Further, it is desired to have such a high speed, reliable oscillator capable of having its frequency selectively changed during oscillation, in reasonably fine increments on the order of 5 nanoseconds, through manual controls (which may be remotely positioned) which electronically select the frequency within the oscillator circuit. It is sought, further, to provide such a reliable, manually selectable electronically programmable oscillator with a direct digital readout.

SUMMARY

In brief, in accordance with one aspect of the invention, a stable, electronically programmed, remotely controllable frequency generating oscillator is described. A series of electronic delay elements providing a conductive path for a recirculating oscillator signal are connected in series to form a primary recirculating loop for the oscillator signal. The series of elements includes a tapped delay having an electronic selection of the taps, and a plurality of electronically selectable or bypassable interpolating delays. The series of elements in the oscillator loop path includes fixed delays and delays inherent in switching elements which in a preferred embodiment result in a minimum time period of approximately 100 nanoseconds for recirculation or cycling of the oscillator signal. An input signal recirculates in the series of elements and through the electronically selected delays, specifically the tapped delay, and the individual bypassable interpolating delays electronically selected, to establish an oscillator frequency which has a period determined by the delays placed in the signal loop.

As indicated, the tapped delay has a limited number of divisions resulting in discrete time increments between taps. In order to establish desired periods between such large increments, interpolating delays can be electronically, optionally placed in the oscillator signal loop series of elements to serially add additional, smaller interpolative time increments to the delay of the oscillator signal. Thus, when the tapped delay has 20 nanosecond time increments between taps, further interpolating delays of 5 and 10 nanosecond increments can be selectively electronically placed in the signal loop to result in a frequency signal generating oscillator having periods selectable in 5 nanosecond increments from 100 nanoseconds to 195 nanoseconds.

For time periods greater than 195 nanoseconds, or that obtained by the primary oscillator signal loop summarized hereinabove, another, fixed delay is available which can be electronically selected and placed in the primary oscillator signal loop. However, the oscillator signal can be made to recirculate in a secondary recirculating signal loop path through this additional fixed delay any number of electronically selected, pre-determined times before it is returned to the primary signal loop.

The way in which the elements are used in the novel system can be illustrated by way of particular examples. Assume, for example, an oscillator period of 175 nanoseconds is desired. Initially, the time period is selected by setting manually controlled digital thumbwheels which actuate a control signal forming means. The control signal forming means generates a set of control signals which electronically selects the interpolating delays and tapped delay selections in the primary oscillator signal loop, and determines the number of traversals in the secondary signal loop. In the assumed example, responsive to the thumbwheel setting, the control signal forming means would generate control signals which select a delay of 60 nanoseconds from the tapped delay line, and 10 additional nanoseconds of delay and 5 additional nanoseconds of delay in the electronically selectable interpolating delays which are selectively placed in the primary loop's series of elements. An additional 100 nanoseconds of delay occurs in the fixed delay of the second delay line and further delays inherent in the loop circuitry, all placed in a series element loop, the output being coupled to the input to form a recirculating signal path. Any signal input into the signal loop is endlessly recirculated with a period of 175 nanoseconds. An output can be taken at any point along the loop that the signal traverses.

Assume, for a second example, that an oscillator period of 375 nanoseconds is desired. The thumbwheels are set to the desired period. Responsive to the thumbwheel setting, control signals are formed which will electronically select the path of the oscillator signal in the desired loop, inserting the required interpolating delays and selecting from the tapped delay. To provide 175 nanoseconds of the primary oscillator loop, the path selected is identical to that described for the 175 nanosecond period of the previous example. For the additional 200 nanosecond time increment, the oscillator signal is routed to an additional fixed delay in the secondary loop, where it recirculates twice in the 100 nanosecond delay of the secondary loop to provide 200 nanoseconds of delay before it is returned to the primary recirculation loop of the system. The control signals generated in response to the thumbwheel setting automatically electronically select and determine the number of cycles or recirculations within the secondary loop for the oscillator signal.

In this way, the period of the primary recirculating loop is increased from the 175 nanoseconds to 375 nanoseconds, the 175 nanoseconds being made up as described above, of traversal through the 60 nanosecond tapped delay line, and through 10 nanosecond and 5 nanosecond interpolative delays, and through 100 nanoseconds of delay in fixed delays and delays inherent in the loop's circuitry.

The system will automatically select the proper elements in the primary loop and the number of recirculating traversals in the secondary loop, to achieve the desired delay in the total oscillator signal loop path. The range of a particular described embodiment of the invention is 100 nanoseconds to 995 nanoseconds in 5 nanosecond increments.

The electronic control signals determining or selecting the individual delay increments in the loop of series elements are generated responsive to the setting of the manually operable digital thumbwheels. The thumbwheel bank can be remotely positioned relative to the oscillator without any interference with the stability or with the accuracy of the oscillator setting. The particular delays that are inserted in the series of elements or loops are thus preselected electronically by electrical control signal forming means responsive to manual selection. The system, further, can include an apparatus to clear the signal loop path of selectable or optional delays every time the oscillator is turned on or off, or every time the frequency or period is reset, to eliminate spurious signals and spurious frequencies or periods from being maintained in the loop. For example, if an oscillator signal is recirculating in the primary signal loop or path in a time period of 150 nanoseconds, and a new period of 450 nanoseconds is desired, the entire series of elements in the oscillator signal path or loop is cleared for a period of approximately 10 milliseconds. A fresh input or activating signal is introduced after the oscillator signal path is electronically constructed in the primary and secondary oscillator loops to achieve the 450 nanosecond period.

The recirculation selector has a series of counters or flip-flops for the purpose of regulating the number of cycles the signal takes in the second delay line and recirculating selector loop before re-entering the primary delay loop. The novel features which are believed to be characteristic of the invention, both as to organization and method or operation, together with further objects and advantages thereof, will be better understood from the following description connected with the accompanying drawings in which several preferred embodiments of the invention are illustrated by way of example. It is to be expressly understood, however, that the drawings are for the purpose of illustration and description only and are not intended as a definition of the limits of the drawings.

FIG. 4 is yet another oscillator signal loop of the preferred embodiment of the present invention;

FIG. 5 is an electrical schematic diagram of electronic controls for the oscillator signal loop of FIG. 4; and FIG. 6 is an electrical circuit schematic of the starting and stopping signal generation of the preferred embodiment of the invention.

Figure 1:
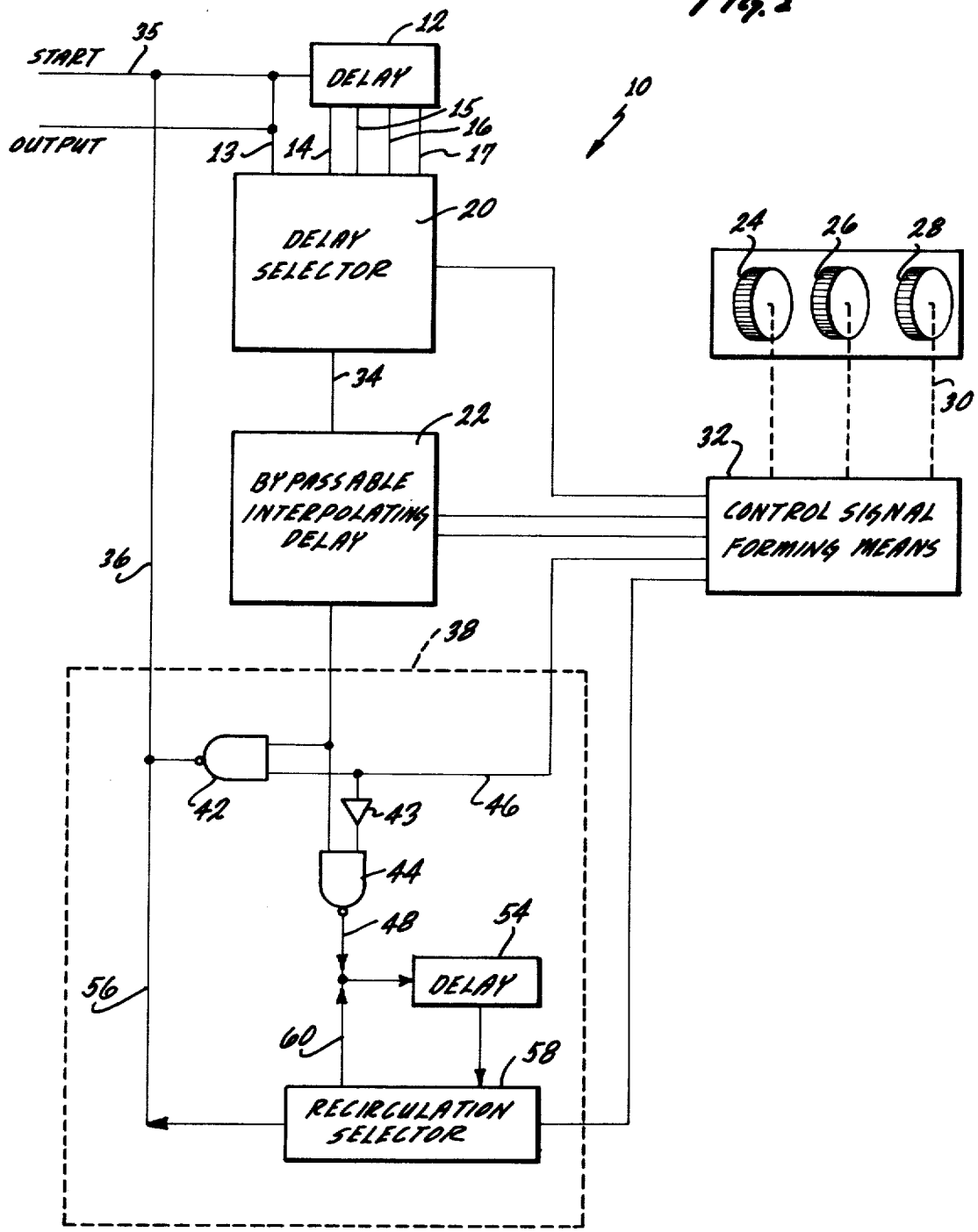
FIG. 1 is a schematic block diagram of an oscillator signal loop, in the preferred embodiment of the invention.

FIG. 1 shows an embodiment of the invention in a block schematic diagram form. The oscillator 10 comprises delay means 12 having a plurality of outputs 14, 15, 16, and 17. A circuit connection 13 bypasses the delay means 12 in selected situations requiring no delay.

It is to be understood herein that the block diagram of FIG. 1 is provided solely for the purpose of aiding the reader in understanding the concepts of the present invention, and is not to be taken as definitive of the preferred embodiment. The preferred embodiment is seen in FIGS. 2, 3, 4, 5 and 6. The block diagram of FIG. 1 is merely an effort to simplify most of the circuit components in overview, block schematic form, for purposes of explaining in a general form the functions of the preferred embodiment.

The delay means 12 has a plurality of successive taps, each tap representing a greater time delay. The outputs 14, 15, 16 and 17 are connected to the taps, thus conveying any signal received by the delay means 12 in timewise successive increments relative to each other.

A delay selector 20 receives all of the signals from the delay means 12 and the bypass 13. The delay selector means 20, by prearranged electronic actuation, selects one of the signals for transmission to the bypassable interpolating delay means 22. The electronic presetting of the delay selector means 20 is arranged by rotary digital thumbwheels 24, 26, 28 mechanically connected as indicated by the dashed lines 30 to electronic circuitry of control signal forming means 32.

The delay selector means 20 is electronically responsive to only a predetermined one of the inputs 13, 14, 15, 16 and 17, and passes the selected signal through connection 34 to bypassable interpolating delay means 22. The delay selector means 20, the bypassable interpolating delay means 22 and the coupling means 38 which will be described in more detail below, have gates and switches electronically controlled by control signal forming means 32. Electronic signals formed by the control signal forming means are predetermined by manual selection of digital rotary thumbwheels 24, 26, 28, mechanically connected to the control signal forming means 32 as indicated by the dashed lines 30.

Another signal from the control signal forming means 32 determines one of a plurality of parallel connected signal paths, each having predetermined fixed delays, for passing a signal to the coupling means 38. The bypassable interpolating delay means 22 may comprise several serially connected delays electronically connected in the oscillator path. The control signal forming means may comprise a plurality of signals for preselecting the required delays to establish the desired oscillation frequency delay set by the digital rotary thumbwheels 24, 26, 28.

In the preferred embodiment, it is contemplated that some of the electronic circuitry itself will provide measureable delay for the oscillator signal. This inherent delay, combined with the delays of the fixed delays in the signal paths form the minimum time period between oscillations which the oscillator is capable of producing. As the electronic selection is made for several of the delay means, the time period of the oscillations is accordingly increased to a maximum. For example, in the preferred embodiment it is contemplated that one hundred nanoseconds would be the minimum time period of the frequency produced. Utilizing only the delay means 12, the bypassable interpolating delay means 22 and the delays inherent in the system, the time period of the oscillation can be increased to 195 nanoseconds.

If a time period of 195 nanoseconds or less is desired, the coupling means 38 can direct the signal through path 36 back to the delay means 12 to begin the oscillator signal loop again. An appropriate voltage state can be established in the input to gate 42, described in greater detail below, from the control signal means 32, so that gate 42 is responsive to a signal from the bypassable interpolating delay means 22. Such responsivity is seen as a sympathetic signal in the output of gate 42, which forms an input to delay means 12.

For time periods greater than 195 nanoseconds, additional delays must be inserted into the oscillator signal loop. The addition to the oscillator signal loop of an additional fixed delay means 54 is accomplished by making gate 44 responsive to the bypassable interpolating delay output signal, while making gate 42 unresponsive thereto. Making the control signal forming means input to gate 42 low will result, by virtue of inverter 43, in a high voltage input to gate 44. If the gates 42, 44 are NAND gates, a high in the control input will make the gate responsive to a positive or high pulse in the signal path, all of which will be explained in greater detail below.

Fixed delay means 54 receives the oscillator signal from the gate 44. The delay means 54 will pass the oscillator signal to a recirculating selector 58, whose optional outputs are preselected also by a signal from the control signal forming means 32.

In the preferred embodiment, the time period set by the oscillator loop from the delay means 12 to the coupling means 38 is in time increments of less than 100 ns (i.e., 5 ns, 10 ns, 15 ns, etc.), and the delay means 54 is set for increments an exponential factor higher; i.e., 100 nanosecond increments. The recirculating selector means 58 is pre-programmed to either forward the oscillator signal by path 56 to the input of delay means 12, or can return the signal to the input of delay means 54 by path 60. Returing the signal to delay means 12, of course, starts the oscillator signal in the loop anew. Returning the signal to delay means 54 merely adds another of the time increment delays preselected for delay means 54.

An output pulse for the oscillator 10 can be tapped at any convenient point in the signal loop. Here, a tap on line 13 is shown. The signal can be started by introducing a pulse into the loop, as in line 35 shown leading to the input of delay 12.

Figure 2:
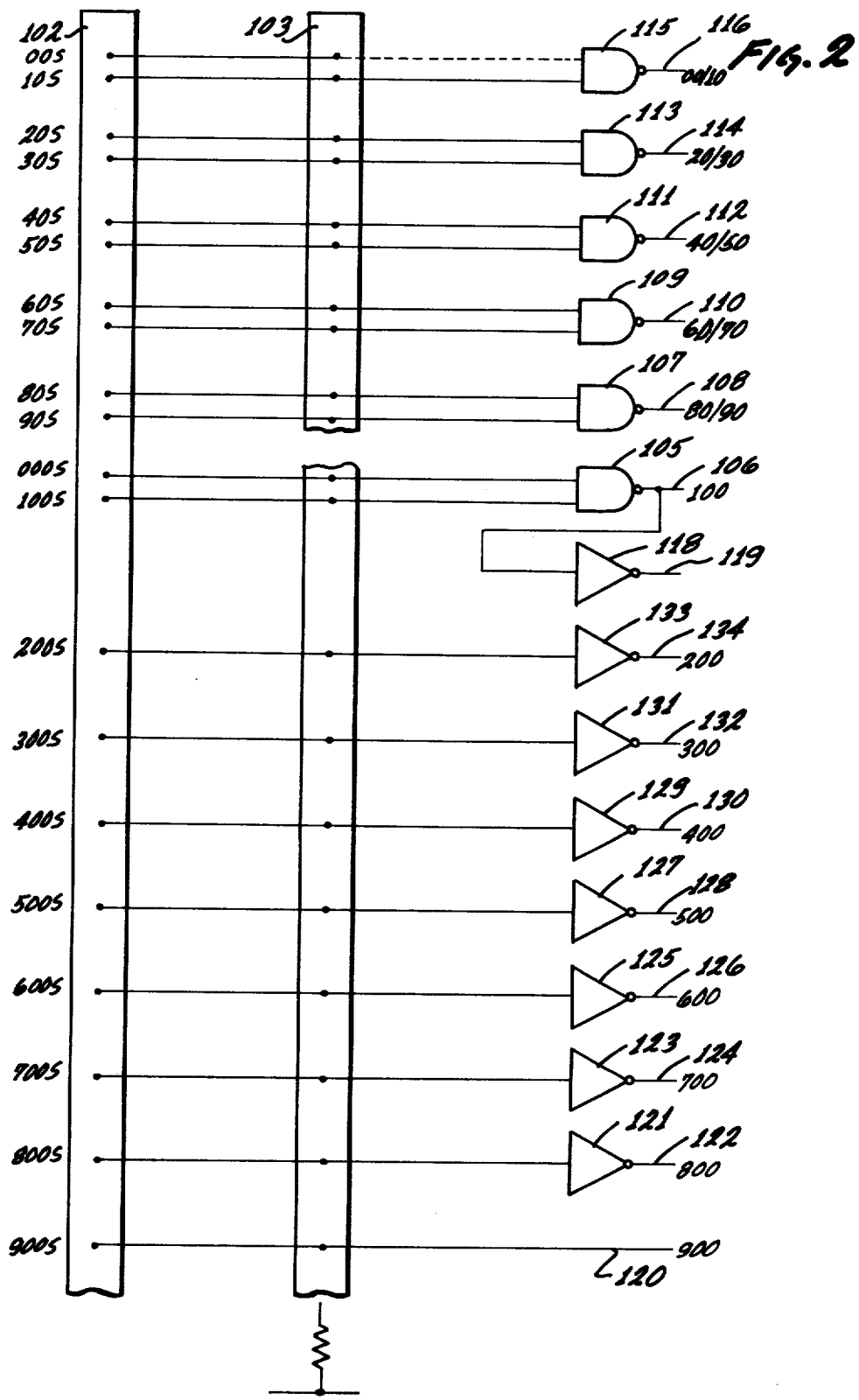
FIG. 2 is an electrical schematic of the electronic control signal generation of the preferred embodiment of the invention.
Figure 3:
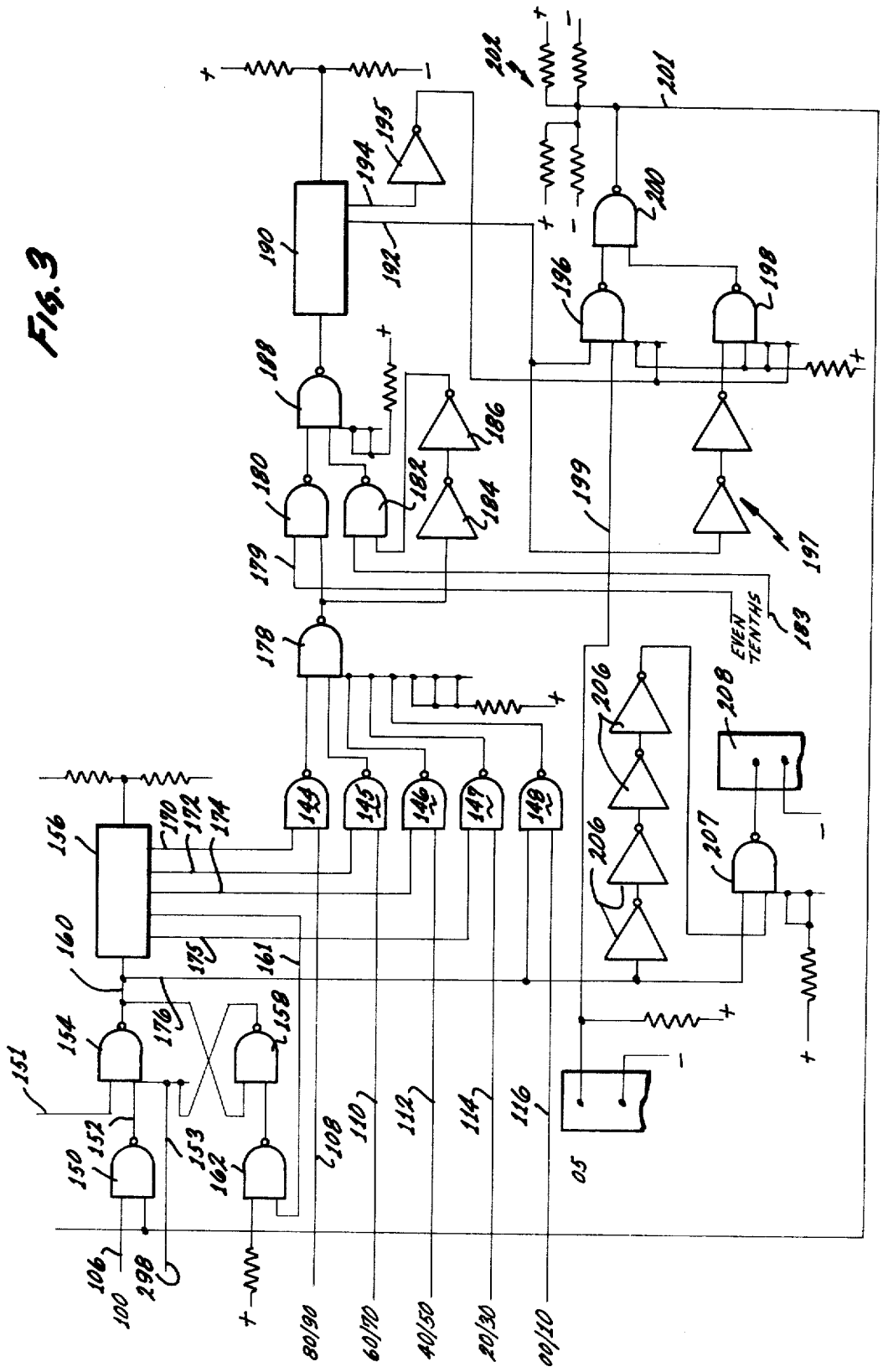
FIG. 3 is an electrical schematic of one oscillator signal loop of the preferred embodiment of the present invention.

FIGS. 2, 3 and 4 show sections of the signal loops or circuits wherein the frequency pulse circulates to cause the pulse generating the oscillation. Turning initially to FIG. 2, a set of parallel buses 102, 103 are energized to a certain, "high" voltage level. Throughout the following explanation, "ground voltage" will sometimes be used interchangeably with the terms "low voltage" or simply "low" or "negative", to indicate a voltage distinctly lower than the "high voltage", "high" or "positive", in the conventional terminology of binary bit computer circuitry. Five NAND gates are connected in parallel with the buses, each gate having dual, parallel inputs from the buses 102, 103.

The NAND gates 105, 107, 109, 111, 113 and 115 consist of positive NAND gates and inverters with what is described as "totem-pole" outputs. Such NAND gates are familiar to those skilled in electronic circuit design, and can be purchased from many electronic component suppliers in the United States. One such supplier, Texas Instruments, Inc. of Dallas, Tex., describes the circuitry in detail in its book *The TTL Data Book*, 2d ed. at page 6-3. Further detailed description of the circuitry will not be given herein, therefore. In many of the gates shown in the present description, only two or three input pins may be shown. It is to be understood that the standard NAND gate may be used, and the other pins made inoperative for purposes of the gate function in the shown circuit. A smaller number of pins may be shown for other types of gates in the circuit, such as NOR gates, Exclusive-OR gates, multivibrators, one-shots and the like, the same convention or understanding being applied. Hereinafter in this description, the use of the term "gate" should be taken as a reference to a NAND gate as described above, unless further specification is given.

Each of the NAND gates 105, 107, 109, 111 and 115 has a corresponding output lead 106, 108, 110, 112, 114 and 116. Lead 106 has a parallel connection leading through inverter 118 having output line 119. Inverters, as in the case of positive NAND gates, are standard electronic components available from many suppliers in the industry, and whose circuitry is well known or is readily available to those skilled in the circuit design art. One such supplier of standard inverter circuits, Texas Instruments, Inc. of Dallas, Texas, describes such an inverter circuit in detail in its book, *The TTL Data Book*, 2d ed. at page 6-3. Further detailed description of the circuitry of the inverter will not be given herein, except to note that the output of the inverter will be the opposite of the input to the inverter.

Similar inverters are connected to the buses 102, 103 in parallel. Each inverter has a corresponding output line 122, 124, 126, 128, 130, 132, 134. An additional output line 120 is also provided.

One of the rotary thumbwheel switches, switch 26 for even tens selections, has the capability, when selecting a particular number, of depressing one of the inputs to one of the gates 105, 107, 109, 111, 113 and 115 to ground. The thumbwheels 24, 26, 28 may be, for example, single ten position (ten output terminal) rotary switch in which the poles are grounded, and ground the corresponding output terminal at any position to which it is switched.

Selection of either 80 or 90 nanoseconds will ground one of the inputs to gate 107. Selection of either 60 or 70 nanoseconds will ground one of the inputs to gate 109. Selection of either 40 or 50 nanoseconds will ground one of the inputs to gate 111. Selection of 20 or 30 nanoseconds will ground one of the inputs to gate 113.

Selections of 0 or 10 nanoseconds will ground one of the inputs to gate 115.

Selection by the rotary thumbwheel switch 24 of increments on the order of 100 nanoseconds will ground a respective one of the inverter inputs. Selection of 100 or 0 by the 100 nanosecond increment rotary thumbwheel, will select either one or the other of the input lines to gate 105.

Therefore, the normal quiescent state of all of the output lines hanging in FIG. 2 is negative or low except output line 119, except for the 100 ns increment and tens ns increment selected by the rotary thumbwheel switches. In such event, the output lines corresponding to the 100 nanosecond and tens nanosecond lines selected will be normally high.

Turning now to FIG. 3, the lines 108, 110, 112, 114 and 116 are seen as inputs corresponding to NAND gates 144, 145, 146, 147 and 148. Line 106, whose quiescent state is established by the selection of either 100 or 0 on the 100 nanosecond increment digital switch 24, comprises one of two inputs to NAND gate 150. The output of gate 150 comprises one of the inputs 152 to NAND gate 154. The output of gate 154 is connected as an input to delay line 156.

Other inputs to gate 154 are taken from a starting signal in line 153 and a signal in line 151 from a 100 nanosecond increment recirculating delay, which will be described in greater detail below in connection with FIG. 6. The fourth input to gate 154 is the output of NAND gate 158, one of whose inputs is the output of gate 154 in a cross-connected circuit. The normal quiescent state of the output 160 of gate 154 is low, and all inputs are normally high. Gate 154, therefore, operates in what normally might be considered a NOR configuration; that is, any negative input will result in a positive output.

The output 160 is connected through delay line 156 as an input to gate 162. Since this output 160 is normally low, the output of gate 162 to gate 158 is normally high. The second input to gate 162, as indicated by FIG. 5, is normally high.

The cross-connected gates 154, 158 operate to form the shape of a pulse travelling through line 160. In the present example, a negative pulse entering any of the normally high inputs to gate 154 results in a positive output 160. This positive output completes a complement of all positive inputs to NAND gate 158, resulting in a negative output which is directed to gate 154. The negative input at gate 154 will maintain the high output regardless of what happens to the initially triggering pulse until gate 158 becomes high in output by the leading edge of a positive pulse in line 161 to gate 162, whose then negative output drives 158 low.

Because the leading edge of a pulse in line 161 comes from the high output from gate 154 after passing through delay line 156, the termination of the high output of gate 154 is determined by a predetermined time delay including not only the delay line 156, but also the gates 158 and 162.

The delay line 156 is a commonly available 100 nanosecond delay which can be obtained commercially from several vendors in the United States, one of which is the Rhombus Electronics Company of Torrance, California. The delay lines selected for the preferred embodiment is a fourteen pin DIP lumped constant type having ten taps at 10% increments along the delay line. A voltage dividing load is connected to the end of the delay line for purposes of tuning the delay characteristics.

It is seen that only give of the possible ten taps of delay line 156 are actually tapped, for the purpose of preventing overloading of the delay line itself. Since one of these taps is used for shaping the pulse in the system, there are only four increments of delay, a fifth increment being given by the parallel line 176 connected directly to the output of gate 154. Accordingly, the delay increments selectable by the lines 108, 110, 112, 114, 116 are twenty nanosecond increments.

Delay line 156 has lines 170, 172, 174 and 175 at the, respectively, 80%, 60%, 40% and 20% taps. Line 161 is connected to the 30% tap, for purposes of shaping the width of the pulse. It can be seen, therefore, that all inputs from delay line 156 to the gates 144, 145, 146, 147, and 148 are normally low unless some condition has been implanted, as will be described below. All of the inputs to NAND gate 178 normally being high, the output is normally low. Gate 178 is seen to act, therefore, as a NOR gate for low signals, being responsive in its output with a high signal upon the input of any low signal.

Gates 180, 182 are connected in parallel to the output of gate 178. Inverters 184, 186 are serially connected with gate 182, all in parallel to the gate 180, for the purpose of introducing a predetermined delay time which may be optionally used or bypassed in accordance with electronic switching resulting from the selections of the thumbwheel switches.

It may be desired to select a ten nanosecond increment within one of the 20 second increments so selected. In such an event, additional delay can be interposed in the pulse path by bypassing gate 180 and utilizing the pulse through gate 182, which is delayed for 10 seconds by the inverters 184, 186. The opening or closing of gate 180 will be described in greater detail below in connection with the operation of the cyclical pulse generation operation.

The normal, quiescent high state of the outputs of both gates 180, 182 make the NAND gate 188 operate normally as a NOR gate. The normally low state of the output of gate 188 is seen in the output taps 192, 194 from delay line 190. Delay line 190 is similar to delay line 156, and arranged with a voltage divider, delay adjusting load as shown. The output line 192 is connected at the 60% tap of line 190. The normally low output of line 192 insures a normally high condition in the outputs of NAND gates 196 and 198. The NAND gate 200 is then seen to operate normally as a NOR gate.

The NAND gate 200 is an open collector type NAND gate of slightly different circuit configuration than the other NAND gates of the present preferred embodiment. Such NAND gates are available from several electronic component manufacturers in the industry, one of whom, Texas Instrument, Inc. of Dallas, Tex., describes the circuitry in detail at page 6-27 of the above-mentioned *TTL Data Book*, 2d ed. Further description of the details of the open collector NAND gate 200 and of other open collector NAND gates which will be identified below, is not given herein, reference being had to the more authoritative descriptions available to the public.

The output 201 of gate 200 is an input to gate 150, as is line 106. Line 201 also comprises an input, along with line 119, to gate 202 of FIG. 6. The details of FIG. 6 will be described in greater detail below.

A second bypassable, interpolating delay is provided between the delay line 190 and the open collector gate 200 in series connected delay inverters 197. The inverters 197, in series with gate 198, are connected in parallel with gate 196. It is intended that the delay 197 will be of the order of 5 nanoseconds, to interject an additional 5 nanosecond delay in the pulse path should further interpolation of the time period within a 10 nanosecond increment be desired.

The normal inputs to gate 196 are positive, with the exception of the line 192. Similarly, the inputs to gate 198 are positive, save for line 192. The parallel branch of 192 leading to gate 198, however, has the additional five nanosecond delay.

The positive output of inverter 195, whose input is connected to a tap 30% later than the line 192, makes the final input complement to each of the gates 196, 198. Any pulse traveling through line 192 will travel through both gates 196 and 198, but through gate 198 five nanoseconds later. Since the pulse at this stage of the pulse path or loop is approximately 28 to 33 nanoseconds long, and since the leading edge of the pulse is used for providing the output signal, it is only necessary to switch gate 196 off to interpose an additional 5 nanosecond delay. Switching gate 196 off is easily done by grounding line 199, accomplished by turning the integer digit rotary thumbwheel 28. Leaving gate 200 responsive to both gates 196 and 198 will make the reaction of gate 200 and consequently its output pulse extended or widened. Pulse shaping circuits at selected parts of the loop will keep the pulse width within desired limits.

Line 201, the output of the open collector gate 200, has a voltage state established by voltage divider 202. It is contemplated that the voltage divider 202 can comprise an interchangeable circuit board of selectable resistors, so that the relative voltage of line 201 can be adjusted. Such adjustment will adjust the delay of the open collector gate 200 by as much as 2 ns more or less. Accordingly, the voltage divider network 202 is considered to be a fine tuning device for adjusting the overall frequency time period by as much as 2 ns by a careful selection of the resistances.

In operation, it is contemplated that the portion of the oscillator circuit shown in FIG. 3 will provide the loop for the clocking pulse in selected frequencies of between 100 and 195 nanoseconds. Inherent in the circuit of FIG. 3 are a number of three or five ns delays caused by the various gate switching operations. Normally, NAND gates of the Schottky type cause approximately a three ns delay. NAND gate circuits of the H type cause somewhere between five and six ns delays, usually of the order of about five and a fourth ns. These delays can be cumulatively ascertained for any given cycle of the pulse by testing and calibrating the loop path.

In addition to the inherent delays of the circuit, the delay of delay line 190 is a fixed delay of approximately 60 ns. The remaining delays inherent in the circuit are calculated in a preferred embodiment to be approximately 40 ns. After the circuit has been initially built, each individual circuit can be calibrated by adjusting the impedances in the voltage divider 202 another two ns one way or the other.

Delays of from 0 to 80 ns can be further inserted into the cycle by appropriate selection of the selector gates 144, 145, 146, 147 and 148. Selecting gate 148 through which to pass the pulse will completely bypass the delays of delay line 156, to result in zero additional delay. Gate 148 is so selected by dialing on the rotary thumbwheel either 0 or 10, which grounds an input to gate 155 (FIG. 2) to make the quiescent state of line 116 high.

Gate 148 will then have a low output upon a positive pulse in line 176.

Gate 147 will output a low pulse when the line 114 is made high by a selection in the digital rotary thumbwheel for either 20 or 30 ns. In a similar manner, upon a positive pulse from delay means 12, gate 146, upon a selection of 40 or 50 ns; gate 145, upon a selection of 60 or 70 ns; and, gate 144, upon a selection of 80 or 90 ns, will be made to output a low negative pulse. Otherwise, these selector gates will have a steady, unchanging output upon the reception of a positive pulse through their corresponding input lines 175, 174, 172 and 170.

A negative pulse received at any of the inputs of NOR configured gate 178 will cause a positive pulse to the input to both of the parallel connected gates 180 and 182. If the rotary thumbwheel 26 has been adjusted to an even tens number, a positive or high quiescent state will be established in the other input 179 to gate 180. The positive pulse from gate 178, therefore, will result in a negative pulse output directed to gate 188. Gate 188, also connected in a NOR configuration, will have a positive output pulse upon the reception of a negative input pulse. The positive output pulse of gate 188 is passed through the fixed delay of approximately 60 ns in delay line 190.

If an odd tens nanosecond increment is selected by the rotary thumbwheel 26, a negative or low state is established in the second input 183 to gate 180. The normally high state of the second input 183 to gate 182 then will pass the positive pulse in the form of a negative pulse output, but only after the positive pulse from gate 178 is delayed an additional 10 nanoseconds in the delay inverters 184 and 186.

The pulse output of gate 188, in the event of an even tens selection, will be extended by approximately ten nanoseconds as a result of the additional time that gate 188 remains open or responsive to gate 182. The gate 188 outputs a high state caused by the lingering low input from gate 182. Since all of the gates in this figure change their state or operate on the basis of the leading edge of the pulse, the lengthening of the pulse through gate 188 by approximately 10 nanoseconds will not affect the ultimate read-out of the oscillator, but will serve only to lengthen the pulse width.

Various pulse reshaping circuit increments are interposed in the loops, however, to keep the pulse at some controllable width. One such pulse shaping circuitry involves the line 194 connecting invertor 195 to the 90% tap of delay line 190. The output of invertor 195 merely returns gates 196 and 198 to their normal, quiescent operating conditions after a pulse from line 192 has changed the states. The cut-off of gates 196 and 198 is thus set at approximately 33 nanoseconds after the pulse from gate 192 connected to the 60% tap. The pulse in the inputs to gate 200 is approximately 28 to 33 nanoseconds long, consequently.

The pulse travelling in line 192 is split into parallel lines, one of which has a built-in five nanosecond delay in the inverters 197. The leading edge of the pulse will initially be seen at the input to gate 196. If all other inputs to gate 196 are positive, a negative pulse output results as an input to NOR gate 200. Gate 200 responds to a negative pulse with a positive output pulse in line 201.

The positive output pulse of gate 200 is delayed for 5 nanoseconds if gate 196 blocks the pulse in line 192. Gate 196 can be made to block by making the quiescent state in line 199 low. Such a quiescent state can be established by grounding line 199, accomplished by dialing the interger digit rotary thumbwheel 28. The leading edge of the pulse in 192 will always cause a change in the output of gate 198. When gate 196 also is responsive to the pulse of line 192, the delayed reception of the changed output of gate 198 as an input to gate 200 will have the result of extending the pulse into line 201 approximately 5 additional nanoseconds. The pulse, now approximately 33 nanoseconds long, is still acceptable for operation within the circuits of the cycle.

The pulse of line 201 comprises an input to gate 150, whose other input is in a high state whenever the 100 nanosecond increment rotary thumbwheel 24 is set to 100. The pulse in line 201, therefore, results in a negative pulse output for gate 150. The NOR configured gate 154 passes a negative pulse input as a positive pulse in line 160.

Gate 154 is cross-connected with gate 158 in order to reshape the pulse being input to the delay line 156. Line 160 is a first of the inputs to gate 158. A second of the inputs to gate 158 is the output of gate 162, whose single operative input is, indirectly, line 160, normally in a low state. The other input to gate 162 is a positive voltage. The first input to gate 162 is connected to the 30%, or 30 nanosecond tap of delay line 156.

A positive pulse output from gate 154 will change the output state of gate 158 to low, keeping gate 154 in its then changed high output state. The leading edge of the pulse, after 30 nanoseconds in delay line 156, changes the output of gate 162 to a low state, returning the output of gate 158, and one of the inputs to gate 154, to high. This change in gate 158 returns gate 154 to its quiescent condition, a low output, thus terminating the pulse passing through the line 160. The pulse width at this point in the loop is approximately 40 nanoseconds. The pulse width will slowly increase until parallel connected gates 196, 198 are encountered The pulse may be started in the loop at any time by interposing a negative pulse in line 153 from a start circuit, described below. The negative pulse in line 153 causes the gate 154 to pulse a positive output, shaped by the cross-connected gate 158. An output can be taken at any point along the system which is convenient. In the preferred embodiment shown, the output is taken on line 176. Optionally, the length of the output signal can be controlled by a parallel connected set of serially connected time delay inverters 206. As shown in the preferred embodiment, the output is seen on a bus 208 receiving its signal from the gate 207.

Turning now to FIG. 4, another portion of the pulse loop is shown, which loop affords additional and optional delays as selected by the electronic switching controlled by the rotary thumbwheels. In the preferred embodiment, it is contemplated that an oscillator having a frequency selectable in 100 nanosecond increments, in addition to the 10 and 5 nanosecond increments selectable in the circuit of FIG. 3, will be desired. Thus, if 200 or more nanoseconds of time between each oscillation is desired, the rotary thumbwheel switch 24 for the 100 nanosecond increments will ground the selected one of the inputs to invertors 121, 123, 125, 127, 129, 131 and 133. By grounding the input to the selected inverter, a high state is established in its corresponding output. The 100 nanosecond increment selector line outputs are connected as inputs to the respective NOR configured gates 252, 254, 256, 258, 260, 262 and 264 of FIG. 5.

Turning now to a detailed understanding of the circuit of FIG. 4, the positive pulse comprising the recirculating, oscillator signal is received at NAND gate 204 to change the output of gate 204 to a negative pulse when line 119 is positive. Line 119 will have a high quiescent state by virtue of inverter 118 when the rotary thumbwheel 24 for the 100 nanosecond increment grounds any of the 100 increment numbers other than 0 or 100. Simultaneously, a low quiescent state will exist in line 106, effectively taking gate 150 out of the signal loop. The output of gate 204 passes through the crossed coupled gates 210, 212 to delay line 214. The cross coupling of gates 210 and 212, along with gate 216 is similar to the cross-coupled gate circuit of gates 154, 158 and 162. A 30%, or 30 nanosecond tap, leads from delay line 214 to an input of NAND gate 216. The normally low output of gate 210 and the output of gate 216 comprise the normal inputs of NAND gate 212, whose output is coupled to the input of gate 210. Whenever the output of gate 210 is changed it is returned to its normal state approximately 40 nanoseconds later by virtue of the delay in the leading edge of the signal fed back through the 30% tap line, and delays in gates 216, 212, and 210.

The output of delay line 214 is connected to the 80% tap for the purpose of delaying the oscillator signal approximately 80 additional nanoseconds. An additional 20 nanoseconds will be placed into the time period of the oscillator signal by virtue of the gates and circuitry inherent in the loop. The output of delay line 214 leads to a pulse shaping circuit 218 and 220, and thence to the parallel connected gates 222 and 224.

Inverter 218, having its output connected in parallel as inputs to open collector NAND gate 220 is placed in the line from the 80% tap of delay line 214 to allow for negative polarity pulses at input of gate 220. The gate 220 in the line is set in a NOR configuration, having an output connected to a voltage dividing network 226 similar to the output of gate 200 described above. By adjustment of the impedances in the voltage divider network 226, fine calibration on the order of 2 nanoseconds or less can be made in the actual delay of the oscillator pulse.

Pulse shaping of the signal going to the gates 222, 224 is achieved by a parallel line 228 connected at the 100% tap of delay line 214. The signal in line 228 delayed approximately 20 nanoseconds from the signal in the line 215, is inverted by inverters 230 to a positive state, and thence input to gates 222 and 224. The gates 222 and 224 are configured to operate, when the respective gate is selected for directing the oscillating signal, in a NOR configuration. Thus the negative or low pulse emanating from the inverter 230 will have the effect of returning the gates 222, 224 to their quiescent state if their outputs changed approximately 28 nanoseconds prior by virtue of the signal in line 215.

If the 100 nanosecond increment selected is 200, a positive state is established in line 134 (see FIG. 2), an input to gate 232. A positive pulse, which can be derived from a convenient connection to delay line 214, shown as tapped at the 60% tap, will then when input to gate 232 change the state of its output. This gate 232 output is an input to the NOR configured gate 233. Gate 233 is cross-connected with gate 234 to, in effect, create a flip-flop. The change in the output of gate 232, therefore, changes the output of gate 234 in line 236. Line 236, normally in a high state, becomes low, presenting a high input on line 240, by virtue of inverter 238, to gate 222. The normally low state in line 240 would make gate 222 normally unresponsive to signals from the delay line 214 in either lines 215 or 228. By thus making gate 222 responsive to a signal in line 215, the positive oscillator pulse in line 215 will change the output of 222 to a negative state, until gate 222 is returned to the normal, quiescent high state by the delayed pulse in line 228. The negative pulse result of gate 228, therefore, is approximately 28 nanoseconds long.

This output pulse of gate 222 is fed directly as an input to gate 154, part of a pulse shaping gate preparing an input pulse to delay line 156, described above in greater detail. The entire time period of the pulse travelling in the circuit of FIG. 4 is approximately 100 nanoseconds, 80 nanoseconds being in the delay line 214. The remaining 20 nanoseconds of delay is achieved by the inherent delays in the switching gates and inverters in the circuit loop.

If the 100 nanosecond increment rotary thumbwheel 24 is directed to one of the 100 increments other than 200, line 134 is low, the output of gate 233 is high, the output of gate 234 is low and, consequently, line 240 is low. Line 236, a direct input to gate 224, is high, making gate 224 responsive to a pulse signal in line 215. Thus, a positive pulse in line 215 will change the normally high output of gate 224 to low. The low state will continue for approximately 28 nanoseconds until it is cut off by the delayed signal of line 228. The output of gate 224 is an input to gate 210, which is responsive to a negative pulse. The travel path of the negative pulse in the output line 242 thus recycles the oscillator signal back through the delay line 214. In this mode, which will be true for all rotary thumbwheel selections of 300 through 900, the output of gate 224 is directed to the C pin of bistable flip-flop 246 of FIG. 7.

Referring now to FIG. 5, bistable flip-flops 246, 248 and 250 are connected in series. The Q output of flip-flop 246 is connected to the C pin of flip-flop 248, and the $\overline{Q}$ output of 248 is in turn connected to the C pin of flip-flop 250. The Q's of each flip-flop are connected to their D pins.

A set of gates 252, 254, 256, 258, 260, 262, and 264 have their outputs as individual inputs to gate 266. The gate 266 is thus in the NOR configuration, since all inputs are positive.

One input to gate 252 is line 132 (FIG. 2). An input to gate 254 is line 130. An input to gate 256 is line 128. An input to gate 258 is line 126. An input to gate 260 is line 124, and an input to gate 262 is line 122. Each of the respective input lines comprises a low input to its corresponding gate, causing high output of the gate except in those circumstances when the line from the rotary thumbwheel switch circuit, and all other inputs are in a high state. The line from the rotary thumbwheel switch circuit will be high when the particular 100 nanosecond increment is selected by the rotary thumbwheel 24.

The Q and $\overline{Q}$ pin of the individual flip-flops are numbered A, $\overline{A}$, B, $\overline{B}$, C an $\overline{C}$, which lettering is also used for the corresponding input pins to the gates 252, 254, 256, 258, 260, 262 and 264 for simplicity. The lines or pins having the same lettering are identical, for convenience in understanding the circuit. The Q pin of flip-flop 246, labeled A, for example, comprises an input to gates 254, 258, 262 and 264.

The $\overline{Q}$ pin of flip-flop 246, labeled $\overline{A}$, comprises an input to gates 252, 256, and 260. The Q pin of flip-flop 248 labeled B, comprises an input to gates 256, 258 and 264. The $\overline{Q}$ pin of flip-flop 248, labeled $\overline{B}$, comprises an input to gates 252, 254, 260 and 262. The Q pin of flip-flop 250, labeled C, comprises an input to gates 260, 262, and 264. The $\overline{Q}$ pin of flip-flop 250, labeled $\overline{C}$, comprises an input to gates 252, 254, 256 and 258.

The series connection of the flip-flops 246, 248 and 250 comprises a counting network. The outputs, Q and $\overline{Q}$ of each respective flip-flop changes its state upon the reception of each different signal in the input pin C. Thus, each time the voltage state of line 242 changes, the output pin Q of flip-flop 246 changes its state. If the output Q changes a second time, output pin $\overline{Q}$ is changed. The change of output pin $\overline{Q}$ of flip-flop 246 will change the output Q of flip-flop 248. Upon the first signal, a negative pulse in line 242 is fed immediately back to gate 210 for a 100 nanosecond delay through delay line 214 and the accompanying circuit. The same negative pulse becomes a positive pulse by inverter 268, as an input to gate 270.

Selection of the number 300 by the rotary thumbwheel 24 makes line 132 high, and the output of gate 252 low. The output of NOR gate 266 is then high, which when complemented by the positive pulse of gate 268, results in a negative pulse output of gate 270. Gate 272, in normal NOR configuration, results in a positive pulse, made negative by inverter 274. The negative pulse of invertor 274 resets the bistable, cross-connected gates 233, 234 (FIG. 4). As explained in greater detail hereinabove, resetting line 236 to a high state has the effect of disabling gate 224, and makes gate 222 responsive to the positive pulse from the delay line 214. Such response is seen as a negative pulse in line 151, directing the pulse back to the 100 to 195 nanosecond delay circuit loop of FIG. 3.

If the 400 nanosecond increment is selected, all input pins but the A pin of gate 254 are high. The A pin becomes high upon the second successive pulse in line 242, as an input to the flip-flop 246. Therefore, the recirculating or oscillating pulse being tracked must occur in line 242 twice, or be recycled through the delay line 214 three times before it passes through gate 222 and into the 100 to 195 nanosecond delay circuit loop of FIG. 3. In a similar manner, the input pins of gate 256 will be high only upon the third successive negative pulse of line 242, which results when the Q pins of flip-flops 246 and 248, and thus all of the input pins of gate 256, are high. Further operation of the counter is now evident, the operation being well known by those skilled in the art. The fourth successive pulse in line 242 results in all of the input pins at gate 258 being high. The fifth successive pulse results in all of the input pins of gate 260 being high. The sixth successive pulse results in all of the pins of gate 262 being high. The seventh successive pulse in effect clears or returns to normal all Q pins of the flip-flops 246, 248 and 250, making all of the input pins to gate 264 high.

The second input to gate 272 is a power-on reset voltage. The state of the second input to gate 272 will always be high when the oscillator is energized, and will be low when the oscillator is cut off, thus stopping all spurious signals that might be floating through the circuit loop before gate 272. The same power-on reset comprises an input to gates 222, 224 of FIG. 4, similarly stopping all spurious signals prior thereto when cut off.

In FIG. 7, a circuit for generating start pulses and terminating pulses is shown. An initial pulse can be begun in line 290. The pulse is routed through parallel loop paths, one path having inverters for the purpose of initiating and, at a predetermined time later terminating the actuation of an output from a typical NAND gate 292. The pulse of gate 292 will be a negative pulse actuating the NOR configured gate 294. The ultimate output is a negative pulse in line 298 after inverter 296, comprising an input to gate 154 (FIG. 3).

The digital selections of the tenth's rotary thumbwheel 26 are connected to gates 300, 302, 304 and 306. Even tens points on the tens rotary thumbwheel 26 are connected to the input pins of gate 300. The odd tens increments are connected to the gate 302. The even 100 ns increments of the 100 ns increment rotary thumbwheel 24 are connected to the input pins of gate 304, while the odd 100 ns increments are connected to the input pins of gate 306.

Gates 300 and 302 are cross-connected in a flip-flop configuration so that every change from an even tens to an odd tens selection will result in a discrete pulse in output line 308. In a quiescent condition, gate 300 is used in a NOR configuration so that a selection of any even tenth number will result in elevating the state of output line 308 to a high. Such a state elevates the state of line 179 to a high condition, making gate 180 (FIG. 3) responsive to positive pulses from gate 178. An odd tens selection reduces the state of output lines 308 to a low, forcing the signal to travel in the parallel path of gate 182 (FIG. 3).

All signals in line 308 are split into parallel paths, one path having series of inverters actuating an Exclusive-OR gate 310. In a similar manner, gate 304 is cross-coupled to gate 306 for controlling the state of output line 316. All even 100 increment numbers are inputs to gate 304. All odd 100 increments numbers are inputs to gate 306. The signal in line 316 is shaped in the Exclusive-OR gate 318. Exclusive-OR gate 318 is controlled by the signal of line 316 passing through the parallel paths, one having the delay inverters 320.

The signals of the Exclusive-OR gates 310, 318 are approximately 25 to 30 nanoseconds. These signals are applied to the one-shot multivibrator 324 through gate 322. The one-shot output is directed to gate 326, whose operation is timed by the reception of parallel conducted signals, one passing through inverters 328.

The output of one-shot 324, further, is connected by line 183 to gates 233 and 182. The output of the one-shot 324 also is connected to line 179 through gate 375 and its following inverter. The other input to gate 375 is the output of gate 308, normally low if an odd tens is selected. Line 179 is low when an odd tens is selected, high when an even tens is selected, except when the one-shot 324 output is low. Line 183 is normally high, except when the output of one-shot 324 is low.

The output of one-shot 324, therefore, insures a low in both lines 179 and 183, disabling both gates 180 and 182 for a brief period of approximately ten milliseconds. The primary oscillator signal loop is thus interrupted for a period that is more than the maximum time period of the oscillator. Spurious signals from a previous frequency selection are thereby prevented from interfering with a newly chosen oscillator signal. Moreover, a sufficient period of down time is provided to eliminate transient signals which frequently result from switch changes. This oscillator loop interruption is automatic, in that it occurs by mere selection of a new frequency by the operator. The signal disabling gates 180 and 182 is sometimes called a "kill signal" inasmuch as it "kills" the primary oscillator loop.

The fixed example illustrations of the Summary hereinabove can be used to summarize the way in which the elements are used in the novel system. In the fixed example of 175 ns period the oscillator loop path will be seen to include elements of FIG. 3, selectively placed in the oscillator loop path by the control signals from the control signal forming means of FIG. 2. In FIG. 2, the manually settable rotary thumbwheel will engage precise inputs to gates or inverters to establish the oscillator loop path elements. Particularly for the selection of 175 ns periods, one of the inputs to gate 105 will be grounded making the state of line 106 high and the state of line 119 low. Additionally, one of the inputs to gate 109 will be grounded, making the state of line 110 high.

Gate 145 consequently will become responsive to a signal in line 172, giving a negative pulse to gate 178 after the oscillator signal has been delayed approximately 60 ns in delay line 156.

Since an odd tens has been selected, the output of gate 302 (FIG. 3) will be low, resulting in a low state in line 308. Line 179, an input to gate 180 will then be low, making gate 180 insensitive or unresponsive to positive pulses from gate 178. Accordingly, the positive pulse output of gate 178 will be directed through delay inverters 184, 186 to gate 182, thus interjecting a ten ns delay between gates 178 and 188 in the oscillator loop path.

The oscillator signal will then be directed to fixed delay 190, where an additional 60 nanoseconds is interjected in the path. The oscillator signal will then be presented through line 192 to both gates 196, 198. Since a 5 ns additional increment has been selected, line 199 will be low, making gate 196 unresponsive to signals in line 192. The oscillator signal will change the state only of gate 198, but only after 5 ns of delay in the delay inverters 197. The oscillator signal is seen at gate 200, therefore, only after the interpolating delays of gate 182 and 198 have been interjected into the oscillator loop path. Line 201 directs the positive pulse output of gate 200 to both gates 150 and 204. Since line 119, an input to gate 204, is low, gate 204 is unresponsive to the oscillator signal. On the other hand, gate 150 is responsive to the positive pulse in line 201, thus directing the oscillator signal to tapped delay 156 through pulse shaping, cross-coupled gates 154 and 158.

The oscillator loop is now seen to comprise 60 ns in delay line 156, 10 ns in inverters 184, 186 and 5 ns in inverters 197. 100 additional ns are placed in the primary loop path, 60 ns in the fixed delay 190 and 40 ns in the cumulative delays of the gates placed in the signal path.

The interjection of the secondary loop into the oscillator path can be illustrated by way of the 375 ns example of the Summary. First, when the rotary thumbwheel settings are reset, a low state is momentarily created in line 183 for approximately 10 milliseconds. This low state causes the outputs of gates 182 (FIG. 3) and 233 (FIG. 4) to go high, thus resetting gates 222, 224 (FIG. 4) and 188 (FIG. 3) to a zero or beginning state, clearing these selectively interjected delays from the loop path.

The odd tens rotary thumbwheel setting creates a low state in line 179, again making gate 180 (FIG. 3) unresponsive to output signals from gate 178, and forcing the oscillator signal to travel through the ten ns delay of inverters 184, 186. Similarly, the 5 additional ns of delay are inserted into the oscillator loop path in line 192 by virtue of the grounding of line 199, all as indicated in the construction of the oscillator loop path for the 175 ns period.

In the 375 ns period, however, the output 106 of gate 105 is returned to a low state, and line 119 is high. Consequently, gate 150 is unresponsive to the oscillator signal output from gate 200, and gate 204 becomes responsive thereto. The oscillator signal is then seen as a negative pulse output of gate 204, resulting in a positive pulse output from gate 210. The positive pulse is delayed 80 ns in delay line 214, and is then directed in line 215 to both gates 222 and 224.

The selection of the 300 ns setting on the rotary thumbwheel grounds the input to inverter 131 (FIG. 2), making line 132 high. The high state of line 132 directly affects gate 252 (FIG. 5).

At this point, line 240 is low, making gate 222 unresponsive to the positive oscillator signal in line 215. The positive oscillator signal, therefore, passes through gate 224 as a negative pulse seen in line 242. The negative pulse of line 242 is directed back as an input to gate 210, and is therefore redirected or recirculated through the secondary loop of FIG. 4. The negative pulse of line 242 is also seen at the C input of bistable flip-flop 246 (FIG. 5) and at the input of inverter 268.

Since all of the inputs to gate 252 (FIG. 5) are high, a negative state is seen as the gate 252 input to gate 266, resulting in a high output therefrom seen at gate 270. Gate 270 then becomes responsive to the positive pulse from inverter 268, resulting in a negative pulse to NOR configured gate 272. The positive pulse output of gate 272 is inverted to a negative pulse output 275 from inverter 274, and seen as an input to gate 233. The negative pulse to gate 233 changes the state of line 240 to high, making gate 222 responsive to the positive pulse now recirculating through the delay line 214. This is the second recirculation through the delay line 214 for the oscillator signal, and at the end of this second recirculating cycle the signal is passed through gate 222, gate 224 being unresponsive to it. Gate 222 passes the negative pulse in line 151 to the input for delay line 156.

The oscillator loop is now seen to comprise 60 ns in delay line 156, 10 ns in inverters 184, 186 and 5 ns in inverters 197, and 2 recirculations or cycles in the recirculating, secondary loop of FIG. 4, all of these elements connected in a series of elements forming a loop. The secondary loop of FIG. 4 provides a total of 100 ns for each recirculation or cycle, 80 ns in the delay line 214, 20 additional ns being inherent in the gates placed in the path. The output is taken from line 160 at the input to delay line 156, and an output signal will be seen every 375 ns.

Although particular embodiments of the present invention have been described and illustrated herein, other embodiments of the present invention and modifications of these embodiments can be perceived by those skilled in the art without departing from the present invention. Accordingly, it is intended that the present invention should be limited only by the scope of the claims appended below.

What is claimed is:

1. A selectable frequency, programmable oscillator, comprising:
    (a) control signal forming means for forming a plurality of control signals representative of a desired oscillator period;
    (b) first delay means for incrementally delaying an oscillator signal input thereto, said first means having a plurality of successive output taps, each tap representing a greater time delay;
    (c) delay selector means coupled to each of said plurality of successive taps and responsive to said control signals for selecting one of said taps;
    (d) fixed delay means coupled to the selected one of said taps, for delaying an oscillator signal a predetermined time period, said fixed delay means comprising an input and an output for said oscillator signal;
    (e) second incremental delay means selectively coupled to the output of said fixed delay means for incrementally delaying a signal input thereto;
    (f) loop selector means coupled to the output of said fixed delay means and responsive to said control signals, for selectively connecting the output of said fixed delay means to one of said first incremental delay means and said second incremental delay means; and
    (g) recirculation selector means coupled to the output of said second incremental delay means and responsive to said control signals for connecting the output of said second incremental delay means selectively to one of the input of said second delay means and of the input of said first incremental delay means.

2. A selectable frequency, programmable oscillator, comprising:
    (a) control signal forming means for forming a plurality of control signals representative of a desired oscillator period;
    (b) first incremental delay means for incrementally delaying an oscillator signal input thereto, said first means having a plurality of successive taps, each tap representing a greater time delay;
    (c) delay selector means coupled to said taps and responsive to said control signals, for selecting one of said taps;
    (d) bypassable interpolating delay means coupled to the selected one of said taps and responsive to said control signals for selectively delaying an oscillator signal in the selected tap a time increment less than the incremental time delay of said first incremental delay means, said bypassable interpolating delay means comprising an output;
    (e) fixed delay means comprising an input coupled to said bypassable interpolating delay means, and an output, for delaying a signal input thereto a predetermined period of time; and
    (f) means coupled to the output of said fixed delay means for returning the oscillator signal to the first means for delaying.

3. The selectable frequency, programmable oscillator of either claim 1 or claim 2, further comprising a manually settable switch unit settable to indicate a desired oscillator time period, and wherein said control signal forming means is coupled to said manually settable switch unit and responsive thereto for forming a plurality of control signals representative of the setting of the switch unit.

4. The selectable frequency, programmable oscillator of either claim 1 or claim 2, wherein said delay selector means comprises a plurality of gates, each gate having at least a plurality of actuating input lines, at least a first of said plurality of actuating input lines being connected to a corresponding tap of said first means for delaying, and a second of said plurality of actuating input lines being selectively enabled in response to said control signals.

5. The selectable frequency programmable oscillator of claim 4 wherein each second of said plurality of actuating input lines receives an input signal from a corresponding NAND gate.

6. The selectable frequency, programmable oscillator of claim 5 wherein said each second of said plurality of actuating input lines is selectively grounded by the selected positioning of the manually settable switch unit.

7. The selectable frequency, programmable oscillator of claim 6 wherein said manually settable switch unit comprises digital rotary thumbwheels, and the second of said actuating input lines to each NAND gate is adapted to be grounded by a selected positioning of a respective rotary thumbwheel.

8. The selectable frequency, programmable oscillator of either claim 1 or claim 2, wherein said control signal forming means includes a digitally incremented rotary thumbhweel.

9. The selectable frequency, programmable oscillator of either claim 1 or claim 2, further comprising pulse trimming means coupled between said fixed delay means and said delay selector means and responsive to a pulse signal passing therethrough for shaping the width thereof.

10. The selectable frequency, programmable oscillator of either claim 1 or claim 2, further comprising pulse shaping means coupled between said fixed delay means and said first means for delaying and responsive to a pulse signal for shaping the width of a pulse signal passing therethrough.

11. The selectable frequency, programmable oscillator of claim 10, wherein said pulse shaping means comprises a flip-flop circuit reducing the width of a signal input thereto to a narrower defined output signal of a predetermined width.

12. The selectable frequency, programmable oscillator of claim 11, further comprising an output tap connected between said pulse shaping means and said first means for delaying.

13. The selectable frequency, programmable oscillator of either claim 1 or claim 2, wherein said bypassable interpolating delay means comprises two circuits selectively coupled between said delay selector means and said fixed delay means, one of said two circuits having means for delaying a signal a predetermined period of time.

14. A selectable frequency, programmable oscillator of either claim 1 or claim 2, wherein said bypassable interpolating delay means comprises two circuits connected in parallel, both of said circuits being coupled to said fixed delay means, one of said circuits in parallel having means for delaying a signal therethrough a predetermined period of time, and the other of said two circuits in parallel having means for selectively opening its circuit.

15. The selectable frequency, programmable oscillator of claim 1 wherein said recirculating selector means includes electronic counter means responsive to control signals for selectively connecting an output of said second means for delaying to an input to one of said first means for delaying and of said second means for delaying to recirculate the oscillator signal a number of times determined by said control signals, through said second means for delaying before being returned to said first means for delaying.

16. The selectable frequency, programmable oscillator of either claim 1 or claim 2 further comprising kill control signal generating means coupled to said control signal forming means and responsive thereto, for generating a kill control signal.

17. The selectable frequency, programmable oscillator of claim 16 further comprising means responsive to said kill control signal for temporarily interrupting the coupling between said first incremental delay means and said fixed delay means to eliminate signals previously recirculating in the oscillator and to eliminate transient signals resulting from switched frequency changes.

18. The selectable frequency, programmable oscillator of claim 17 wherein said means responsive to said kill control signal interrupts the coupling for a period of time at least ten milliseconds.

* * * * *